United States Patent
Bottomley et al.

(10) Patent No.: US 6,243,428 B1
(45) Date of Patent: Jun. 5, 2001

(54) METHOD AND APPARATUS FOR BAND-ADAPTIVE DEMODULATION

(75) Inventors: Gregory E. Bottomley; Torbjörn Sölve, both of Cary, NC (US)

(73) Assignee: Ericsson Inc., Research Triangle Park, NC (US)

(*) Notice: Subject to any disclaimer, the term of this patent is extended or adjusted under 35 U.S.C. 154(b) by 0 days.

(21) Appl. No.: 08/873,126

(22) Filed: Jun. 11, 1997

(51) Int. Cl.[7] .................................................. H04L 27/06
(52) U.S. Cl. ........................................... 375/316; 375/344
(58) Field of Search .................................. 455/552, 553; 375/229, 231, 232, 233, 259, 316, 340, 344, 346

(56) References Cited

U.S. PATENT DOCUMENTS

| | | | |
|---|---|---|---|
| 4,868,850 | * 9/1989 | Kaku et al. | 375/231 |
| 5,260,972 | * 11/1993 | Wang | 375/231 |
| 5,303,226 | * 4/1994 | Okanoue et al. | 375/231 |
| 5,359,628 | * 10/1994 | Muto | 375/340 |
| 5,479,444 | * 12/1995 | Malkamaki et al. | 375/231 |
| 5,499,268 | * 3/1996 | Takahashi | 375/231 |
| 5,506,871 | * 4/1996 | Hwang et al. | 375/231 |
| 5,787,131 | * 7/1998 | Bottomley | 375/347 |
| 5,822,380 | * 10/1998 | Bottomley et al. | 375/347 |
| 5,978,416 | * 11/1999 | Watanbe et al. | 375/231 |

\* cited by examiner

*Primary Examiner*—Tesfaldet Bocure
(74) *Attorney, Agent, or Firm*—Wood, Phillips, VanSanten, Clark & Mortimer

(57) ABSTRACT

In a multi-band, digital communication system, such as a dual-band digital cellular telephone system, baseband signal processing is accomplished by selecting, from amongst a number of baseband signal processing parameter sets, a best, most appropriate baseband signal processing parameter set, as a function of the frequency band of the received communication signal.

30 Claims, 4 Drawing Sheets

METHOD AND APPARATUS FOR BAND-ADAPTIVE DEMODULATION

BACKGROUND

The present invention relates to the processing of signals in a communication system. More particularly, the present invention relates to adaptively demodulating a baseband signal in a communication system as a function of the frequency band in which the corresponding modulated signal was transmitted.

The demand for wireless communication services has been expanding at an extraordinary rate. To accommodate this demand, the radio spectrum available for wireless communication has increased. For example, wireless communication systems, such as cellular telephone systems, now use a mixture of cellular and PCS frequency bands. Thus, as customers travel across the country and receive service from different cellular providers, the cellular customers now, more than ever, require mobile phones that are capable of dual-band operation to assure seamless phone service.

In addition, various modulation methods and multiple access techniques have been employed to further satisfy the high demand for wireless services. Frequency division multiple access, or FDMA, is, of course, the traditional method. Here, the frequency spectrum is divided into a number of radio channels, wherein each channel corresponds to a different carrier frequency. Time division multiple access, or TDMA, is another method in which each carrier frequency or frequency channel in an FDMA system is further divided into time slots, each of which are assigned to a different user. Therefore, each frequency channel can accommodate multiple users. As will be recognized by one of ordinary skill in the art, TDMA and FDMA are employed in the D-AMPS, PDC, and GSM digital cellular systems. If the radio channel is wide enough, multiple users can use the same channel using spread spectrum techniques and code division multiple access or CDMA. IS-95 and J-STD-008 are examples of CDMA standards.

In a digital communication system, information such as cellular speech, e-mail and internet data is represented by a series of binary information symbols. These binary information symbols are then encoded and modulated so that they can be transferred from a sending unit to a receiving unit over a transmission medium, such as a wire, the air, or magnetic tape. For example, in a digital cellular phone system, the bits representing cellular speech are modulated and the resulting waveform is then transmitted from a base station to a cellular mobile phone unit. In order for the cellular customer to hear the speech, the mobile phone must employ a receiver capable of receiving and demodulating the waveform, and ultimately capable of recovering the sequence of binary information symbols to reproduce the speech.

To accomplish this, a digital receiver comprises, among other things, a radio signal processor. The radio signal processor is tuned to the frequency band and carrier frequency of the transmitted signal. This allows the receiver to pick-up the transmitted signal. The radio signal processor then amplifies, mixes, and filters the transmitted signal down to baseband. While baseband typically refers to zero intermediate frequency, it is used herein to refer to a fixed reference intermediate frequency.

The transmission medium, however, can introduce interference and other phenomena that may distort the transmitted signal. For example, the transmission medium may introduce intersymbol interference, multipath effects or co-channel interference. In addition, a frequency error at the receiver may cause the baseband waveform to rotate, thereby affecting the received signal's in-phase (I) and quadrature (Q) components. These effects are not generally removed from the transmitted signal by the radio signal processor. Therefore, in order to recover the desired binary information symbols from the baseband signal, a receiver typically employs a baseband processor.

In dealing with signal interference and distortion, the baseband processor may, in turn, employ an equalizer. An equalizer is a specialized filter that tracks various channel characteristics, for example, the extent to which the waveform is distorted by the transmission medium. In general, the equalizer tracks channel characteristics by periodically obtaining a channel tap. This is accomplished by generating expected received values (e.g., using known or detected symbols). The expected received values are compared to the actual received values, and the difference between what was actually received and what was expected reflects the channel characteristic being tracked. The equalizer can then use this information to adjust the channel tap estimates to compensate for the interference and/or distortion introduced by the transmission medium.

The adaptation rate or the rate at which the equalizer obtains a channel tap is often referred to as the channel tracking step size. The channel tracking step size depends upon how fast the channel is changing. This, in turn, depends upon, among other things, the corresponding frequency band and/or the carrier frequency of the transmitted signal. For example, the higher the frequency band or carrier frequency, the faster the channel characteristics tend to change. However, the radio signal processor removes the carrier frequency, hence, this information is not available to help the baseband processor decide how to properly set the adaptation rate. Consequently, baseband processors are traditionally designed to set the adaptation rate in accordance with worst possible case conditions (e.g., the highest frequency band and/or the highest carrier frequency).

When the worst case conditions are not in fact present, the traditional method for setting the adaptation rate based upon a worst case scenario results in overuse of baseband signal processing or poor tracking performance. Overuse of baseband processing tends to be very time consuming, it results in less accurate binary information symbol detection, and it can rapidly drain the receiving unit's power source (e.g., a battery).

Other solutions have been proposed. For example, U.S. Pat. No. 5,230,007 (Baum et al.) proposes to adapt the channel tracking step size in response to the performance of the channel tracker itself. Such an approach requires added complexity in estimating performance for different tracking step sizes and determining which tracker is performing best. Because performance estimation is not perfect, the best tracking step size is not always utilized. Alternatively, U.S. Pat. No. 5,268,930 (Sendyk et al.) proposes to estimate the speed of the mobile phone to determine channel tracking step size. Again, there is added complexity, because of the need to estimate the speed of the vehicle in which the phone is being transported. Also, inaccurate vehicle speed estimations will result in performance loss.

Therefore, in a digital communication system that employs a relatively large dynamic frequency range, such as a dual-band cellular telephone system, there is a need to improve the efficiency of the receiver. In particular, there is a need to improve the baseband processing function of the receiver, such that the baseband processor can more efficiently compensate for interference and distortion introduced by the transmission medium, more accurately recover the binary information symbols, and reproduce a high speech quality, without placing an excessive drain on the power source of the unit.

SUMMARY

Accordingly, it is an objective of the present invention to provide a receiver that has the ability to process baseband signals more efficiently and effectively.

It is another objective of the present invention to provide a multiple or dual-band receiver that possesses a baseband processor capable of adaptively processing a baseband signal without overuse of baseband processing, accurately detecting the communication information, and preventing rapid drain on a power source.

In accordance with one aspect of the present invention, the foregoing and other objects are achieved by a system and/or a method that involves generating a baseband signal from a received radio frequency signal; selecting a set of processing parameters based on the frequency band of the radio frequency signal; and adaptively processing the baseband signal using the selected set of processing parameters.

In accordance with another aspect of the present invention, the foregoing and other objects are achieved by a radio receiver and/or a method for receiving radio signals wherein a baseband signal is produced from a received radio frequency signal and a control signal is generated as a function of the received radio frequency signal's frequency band. The receiver and/or method also involves a baseband processor for receiving and processing the baseband signal, and a baseband processor control unit for adaptively controlling the baseband processor as a function of the control signal.

In accordance with another aspect of the present invention, the foregoing and other objects are achieved by a system and/or method that involves receiving and converting a communication signal into a baseband signal; providing frequency band information corresponding to the communication signal; extracting digital information from the baseband signal; and adaptively controlling the baseband processor as a function of the frequency band information.

BRIEF DESCRIPTION OF THE DRAWINGS

The objects and advantages of the invention will be understood by reading the following detailed description in conjunction with the drawings in which.

DETAILED DESCRIPTION

Figure 1:
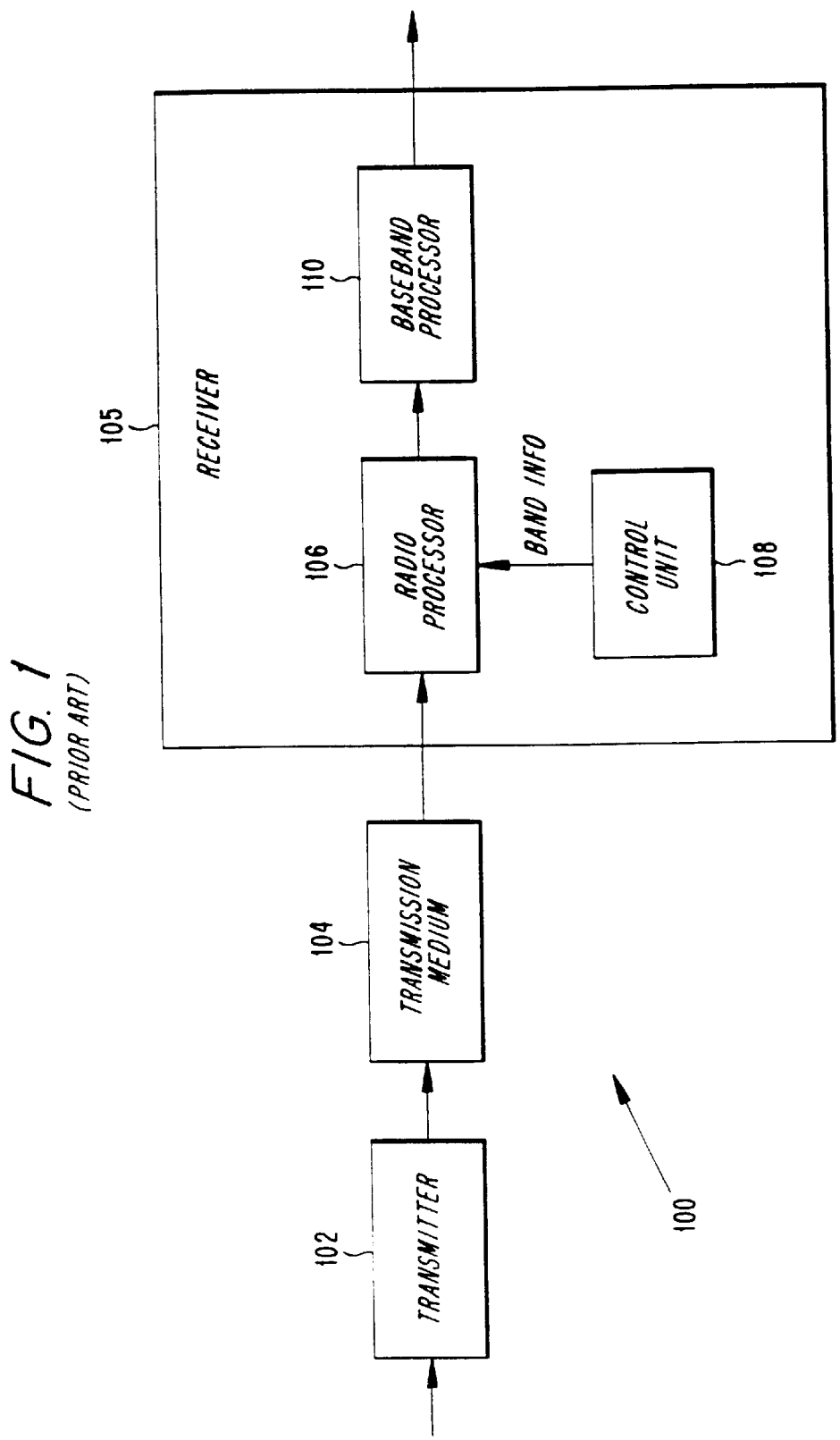
FIG. 1 is a diagram of a digital communication system in accordance with the prior art.

The various features of the invention will now be described with respect to the figures, in which like parts are identified with the same reference characters.

A typical digital communication system 100 is shown in FIG. 1. In such a system, digital symbols are provided to a transmitter 102. The transmitter 102 then applies modulation to the digital symbols, maps them to a representation that is appropriate for a transmission medium 104 (e.g., air), and transmits the modulated signal over the transmission medium 104 to a receiver 105.

The receiver 105 comprises a radio processor 106, a control unit 108, and a baseband signal processor 110. The control unit 108 provides the radio processor 106 with information regarding the signal band (i.e., frequency band information), and possibly carrier frequency information, corresponding to the transmitted signal. The radio processor 106 then filters, amplifies, and mixes the received signal down to baseband or alternatively, down to an intermediate frequency (IF) band. The baseband processor 110 receives the baseband or IF signal from the radio processor 106, processes the baseband or IF signal in accordance with one or more parameter sets, and produces estimates of the digital symbol values. As one skilled in the art will recognize, the baseband processor 110 may also provide soft estimates of the digital symbol values as well as reliability information. The estimated digital symbol values are then converted into, for example, speech, text or images.

As stated, the baseband processor 110 processes the baseband or IF signal, in accordance with a set of signal processing parameters. For example, the parameter set may define the rate at which a channel tracker within the baseband processor 110 will obtain channel taps. The information derived from the channel taps is then used to adjust the baseband signal to compensate for interference and distortion introduced by the transmission medium 104. However, the selection of one set of parameter values over another set of parameter values may depend upon the rate at which the channel characteristics are changing. This, in turn, will depend upon several factors including the frequency band and/or carrier frequency of the transmitted signal. Since the baseband processor 110 does not possess information relating to the frequency band or carrier frequency of the transmitted signal, the baseband processor 110 cannot select an appropriate set of parameter values. Instead, the baseband processor 110 is designed with a fixed set of parameter values which assume a worst case condition (i.e., the highest possible frequency band or carrier frequency). As stated above, assuming a worst case condition, when the worst case condition is not in fact present, results in an inefficient and often inaccurate baseband processing function.

Figure 2:
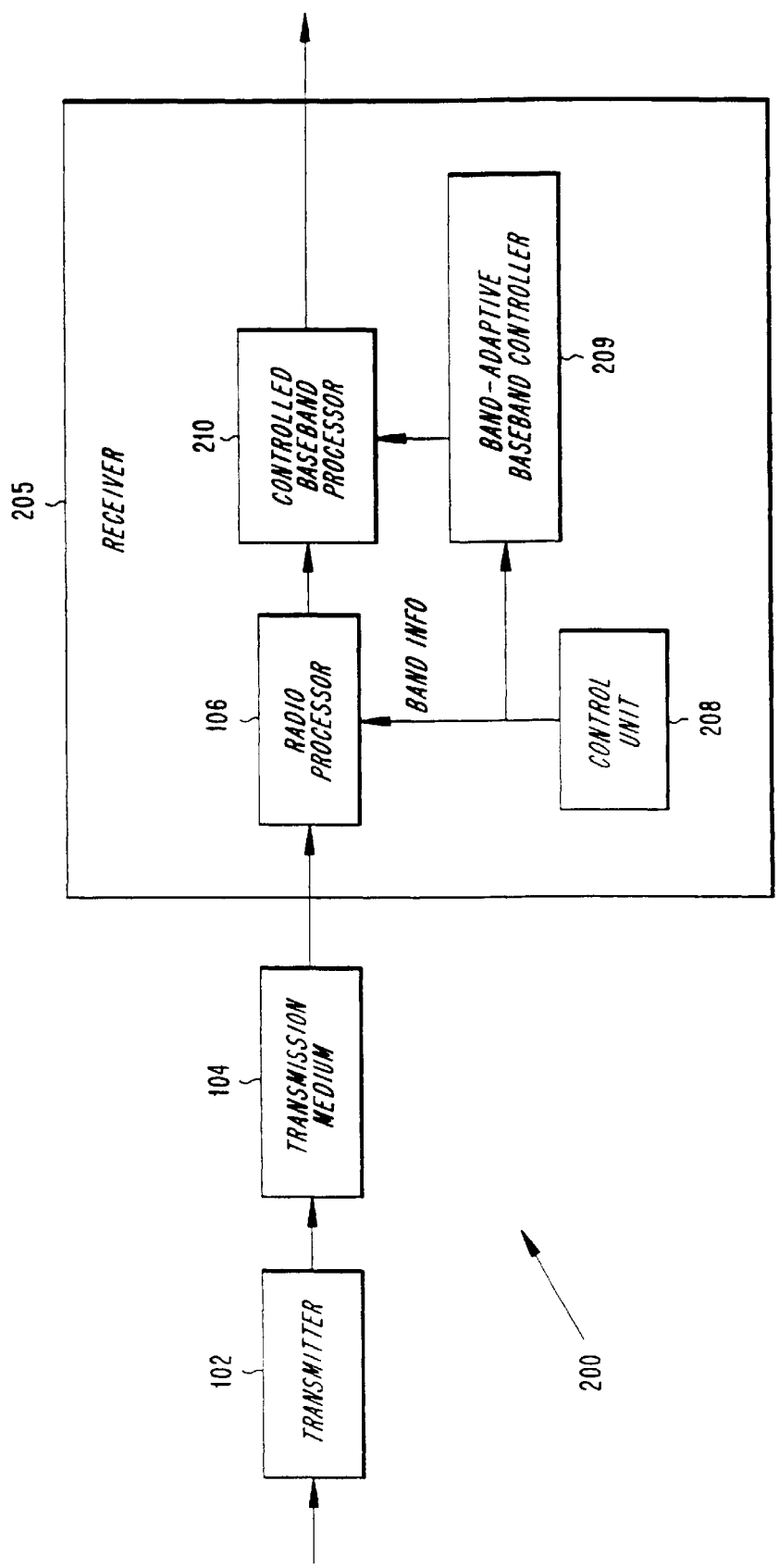
FIG. 2 is a diagram of a digital communication system in accordance with one aspect of the present invention.

In contrast, a digital communication system 200, in accordance with a preferred embodiment of the present invention, is shown in FIG. 2, where like elements with FIG. 1 correspond to each other. A receiver 205, like receiver 105, comprises the radio processor 106. In addition, the receiver 205 comprises a control unit 208, a band-adaptive baseband controller 209, and a controlled baseband signal processor 210.

Unlike in the receiver 105, the band-adaptive baseband controller 209 receives information from the control unit 208 relating to the frequency band, and possibly the carrier frequency, corresponding to the transmitted signal. In general, frequency band can refer to a collection of radio channels or one radio channel. The band-adaptive baseband controller 209 utilizes this frequency band information to control the baseband processing function performed by the controlled baseband processor 210. For example, the band-adaptive baseband controller 209 can select from amongst a number of baseband signal processing methods (or sets of baseband processing parameters), a best, most appropriate signal processing method given the frequency band or carrier frequency information provided by the control unit 208.

Figure 3:
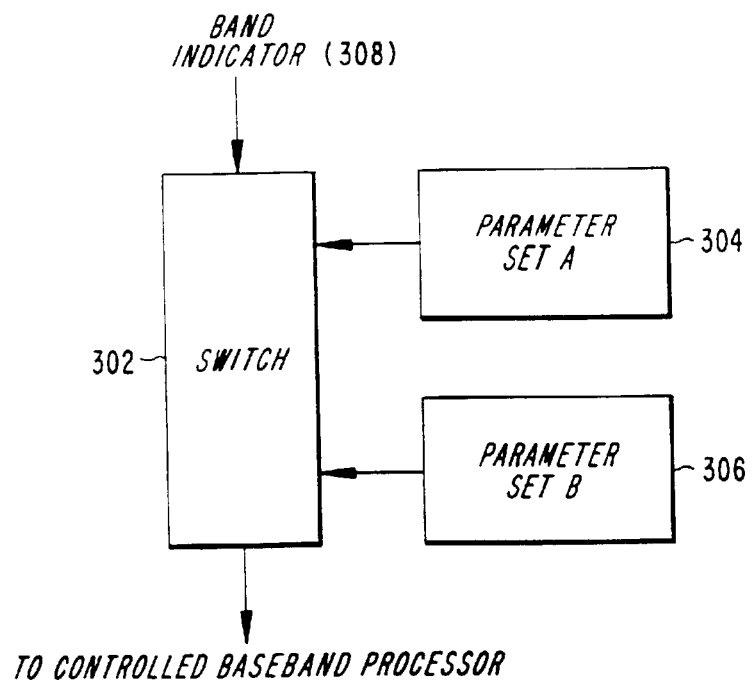
FIG. 3 is a diagram of an exemplary band-adaptive baseband controller.

An exemplary embodiment of the band-adaptive baseband controller 209 is illustrated in FIG. 3. According to this exemplary embodiment, the band-adaptive baseband controller 209 comprises a switch 302 and at least two baseband signal processing parameter sets 304 and 306. The switch 302, which one of skill in the art will recognize, may be implemented in hardware and/or software, is operatively connected to a frequency band indicator signal 308. If an application involves a cellular telephone communication system, the frequency band indicator signal 308 may identify that the frequency band is the lower frequency cellular band or, alternatively, the higher frequency PCS band. The switch 302 then provides the most appropriate baseband signal processing parameter set 304 or 306 to the controlled baseband processor 210, which in turn receives and utilizes the most appropriate parameter set to process the baseband signal. For example, each of the at least two baseband signal processing parameter sets 304 and 306 may contain parameters for establishing a different channel tracking step size. Alternatively, each of the at least two baseband signal processing parameter sets 304 and 306 may contain different loop filter coefficients for an automatic frequency correction (AFC) unit.

Figure 4:
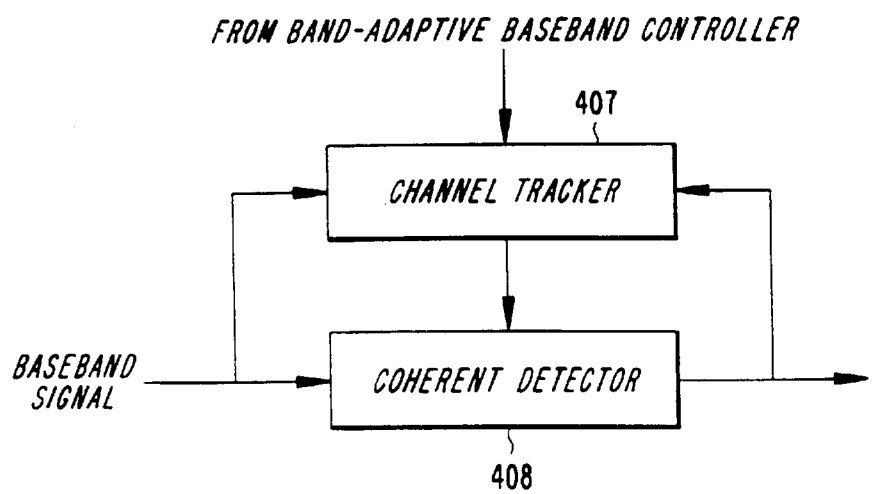
FIG. 4 is a diagram of a baseband processor containing a channel tracker and a coherent detector.

An exemplary embodiment of the controlled baseband processor 210 is illustrated in FIG. 4. In FIG. 4, the controlled baseband processor 210 is shown to include a channel tracker 407 and a coherent detector 408. The parameter values associated with the most appropriate parameter set, given the frequency band or carrier frequency information provided by the band-adaptive baseband controller 209, are made available to the channel tracker 407. As stated, the parameter set may include parameters that specifically control the channel tracking step size. The channel tracker 407 utilizes the parameter values provided by the band-adaptive controller 209, the baseband signal provided by the radio processor 106, and detected digital symbol values from the coherent detector 408 to track the channel. Upon processing the baseband signal, in accordance with the most appropriate parameter set, the coherent detector 408 can more accurately detect the digital symbols. One skilled in the art will also readily understand that the coherent detector 408 may include an equalizer, the function of which was described above. More specifically, in a TDMA system, the coherent detector 408 could be a maximum likelihood sequence estimation (MLSE) equalizer. In a CDMA system, the coherent detector could be a Rake receiver. In either case, if known symbol values are used to detect the channel (e.g., pilot channel or pilot symbols), then the output of the coherent detector 408 need not be provided to the channel tracker 407.

Although the above-identified embodiment is focused on a channel tracking application, the present invention is not limited to baseline processing involving channel tracking. In yet another exemplary embodiment, the selected parameter set provided by the band-adaptive baseband controller 209 can be used to determine how complex the demodulation of the baseband signal has to be. For example, while one frequency band may require the use of per-survivor-processing, another band may not, where per-survivor-processing involves utilizing multiple channel estimates each corresponding to different possible symbol sequences, as is well known in the art. In yet another exemplary embodiment, the selected parameter set can be used to determine how fast to track equalizer filter coefficients in, for example, transversal or decision feedback equalizers. In general, the selected parameters may include, control signals for selecting various baseband processing functions.

In still another exemplary embodiment, the selected parameter set provided by the band-adaptive baseband controller 209 can be used to control the process by which the baseband processor 210 updates the estimation of a particular channel characteristic. For example, the estimation of a particular channel characteristic X might be updated in accordance with the following relationship:

$$X_{present} = X_{previous} + \lambda X_{update} \qquad (1)$$

where $\lambda$ represents a weighting function. As stated above, the PCS band is a higher frequency band than the cellular band. It was also stated above that channel characteristics tend to change more rapidly with respect to higher frequencies. Therefore, in the above-identified relationship, it may be more appropriate to apply a higher weighting factor $\lambda$ to $X_{previous}$ if the corresponding frequency band is the PCS band. In contrast, it might be more appropriate to apply a lower weighting factor $\lambda$ to $X_{previous}$ if the corresponding frequency band is the cellular band. In accordance with this exemplary embodiment of the present invention, the particular value of the weighting factor $\lambda$ could be selected by the band-adaptive baseband controller 209, as a function of the given frequency band, and subsequently supplied to the controlled baseband controller 210 for use in processing the baseband signal.

Figure 5:
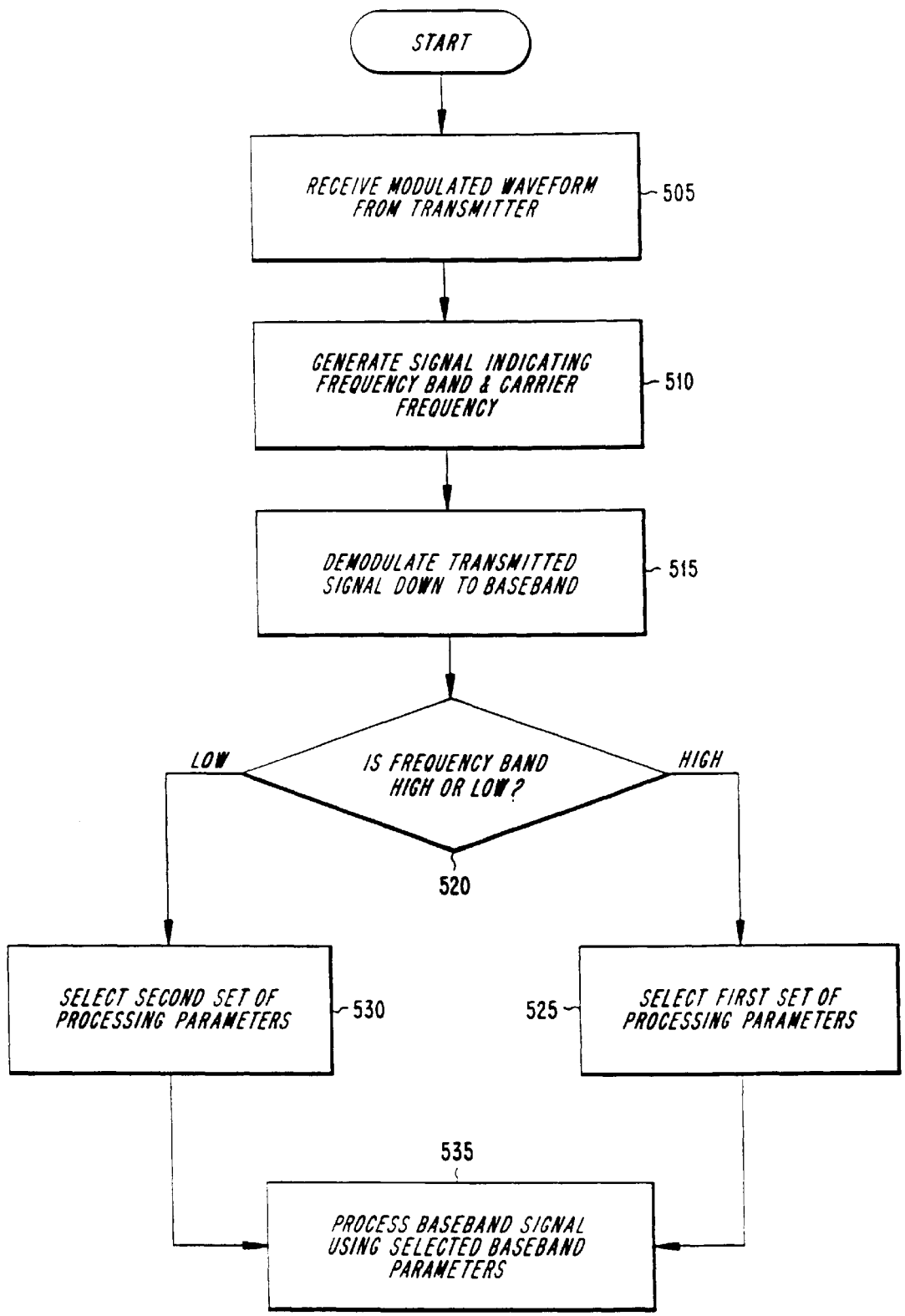
FIG. 5 is a flowchart depicting an exemplary method in accordance with the present invention.

A flowchart depicting a general technique for accomplishing any of the above-identified embodiments is shown in FIG. 5. The technique begins when a modulated waveform is received from the transmitter (step 505). A signal is then generated indicating the frequency band, and possibly the carrier frequency, associated with the transmitted signal (step 510). The transmitted signal is then filtered, amplified and mixed down to baseband, or alternatively to an IF band (step 515). A test is performed to determine the corresponding frequency band, in accordance with the band information provided by the indicator signal described above. If the corresponding frequency band is high, indicating for example, the PCS band, in accordance with the "HIGH" branch out of decision block 520, then a first set of baseband signal processing parameters will be selected (step 525). However, if the corresponding frequency band is low, indicating for example, the cellular band, in accordance with the "LOW" branch out of decision block 520, then a second set of baseband signal processing parameters will be selected (step 530). The baseband signal, or the IF signal, is then processed in order to extract the digital symbol information in accordance with the selected parameter set (step 535).

The invention has been described with reference to several exemplary embodiments. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. For example, the invention is described primarily in the context of a radio communication system, wherein that modulated signal is transmitted over the air; however, the invention is not limited to such a system. It also is applicable to wireline communication systems and magnetic storage systems. Thus, the scope of the invention is given by the appended claims, rather than the preceding description, and all variations and equivalents which fall within the range of the claims are intended to be embraced therein.

What is claimed is:

1. A baseband signal processor comprising:
   means for receiving a baseband communication signal corresponding to a received radio frequency signal;

baseband processor control means for receiving frequency band information corresponding to the received radio frequency signal, and selecting a set of baseband signal processing parameters from a plurality of baseband signal processing sets based on the received frequency band information; and baseband processor means for adaptively processing the baseband communication signal using the selected set of baseband signal processing parameters.

2. The baseband signal processor of claim 1, wherein the selected set of baseband signal processing parameters includes channel tracking parameters.

3. The baseband signal processor of claim 2, wherein the channel tracking parameters include a parameter value defining channel tracking step size.

4. The baseband signal processor of claim 1, wherein the selected set of baseband signal processing parameters includes automatic frequency control parameters.

5. The baseband signal processor of claim 4, wherein the automatic frequency control parameters include parameter values defining loop filter coefficients.

6. A radio receiver comprising:

radio signal receiving means for producing a baseband signal from a received radio frequency signal;

frequency indicator means for generating a baseband control signal as a function of a frequency band corresponding to the received radio frequency signal;

baseband processor for receiving and processing the baseband signal; and baseband processor control unit for receiving the baseband control signal, and adaptively controlling the baseband processor as a function of the baseband control signal.

7. The receiver in claim 6, wherein the baseband processor control unit comprises:

a switch for selecting a set of baseband processing parameters as a function of the baseband control signal.

8. The receiver in claim 7, wherein the baseband processor processes the baseband signal in accordance with the selected set of baseband processing parameters.

9. The receiver in claim 8, wherein the selected set of baseband processing parameters includes channel tracking parameters.

10. The receiver in claim 8, wherein the selected set of baseband processing parameters includes automatic frequency control parameters.

11. A digital communication system comprising:

a radio processor for receiving and converting a communication signal into a baseband signal;

a receiver control unit for providing frequency band information corresponding to the communication signal;

a baseband processor for extracting digital information from the baseband signal; and a baseband processor control unit for adaptively controlling the baseband processor as a function of the frequency band information provided by the receiver control unit.

12. The system of claim 11, wherein the baseband processor control unit comprises:

a switch for selecting a set of baseband processing parameters as a function of the frequency band information.

13. The system of claim 12, wherein the baseband processor comprises:

means for receiving the set of baseband processing parameters from the baseband processor control unit, wherein the baseband processor extracts the digital information from the baseband signal using the received set of baseband processing parameters.

14. The system of claim 13, wherein the selected set of baseband processing parameters includes channel tracking parameters.

15. The system of claim 13, wherein the selected set of baseband processing parameters includes automatic frequency control parameters.

16. A method for processing a baseband communication signal comprising the steps of:

receiving a baseband signal corresponding to a radio frequency signal;

receiving frequency band information corresponding to the radio frequency signal at a baseband processor controller;

selecting a set of baseband signal processing parameters based on the received frequency band information; and adaptively processing the baseband signal based on the selected set of baseband signal processing parameters.

17. The method of claim 16, wherein the selected set of baseband signal processing parameters includes channel tracking parameters.

18. The method of claim 17, wherein the channel tracking parameters includes a channel tracking step size.

19. The method of claim 16, wherein the selected set of baseband signal processing parameters includes automatic frequency control parameters.

20. The method of claim 19, wherein the set of automatic frequency control parameters includes loop filter coefficients.

21. A method for receiving a radio communication signal and processing a corresponding baseband signal, the method comprising the steps of:

receiving the radio communication signal;

converting the radio communication signal to the corresponding baseband signal;

generating a baseband control signal based on a frequency band corresponding to the radio communications signal;

receiving the baseband control signal at a baseband control unit; and adaptively processing the baseband signal as a function of the received baseband control signal.

22. The method of claim 21, wherein the step of adaptively processing the baseband signal comprises the step of:

selecting a set of baseband processing parameters based on the control signal.

23. The method of claim 22, wherein the step of adaptively processing the baseband signal further comprises the step of:

processing the baseband signal in accordance with the selected set of baseband processing parameters.

24. The method of claim 23, wherein the selected set of baseband processing parameters includes channel tracking parameters.

25. The method of claim 23, wherein the selected set of baseband processing parameters includes automatic frequency control parameters.

26. In a digital communication system, a method of adaptively generating a digital signal from a baseband signal, the method comprising the steps of:

transmitting a modulated communication signal;

receiving the modulated communication signal and converting the modulated communication signal into a baseband signal;

generating a baseband control signal based on a frequency band corresponding to the modulated communication signal;

receiving the baseband control signal at a baseband processor control unit; and generating at a baseband processor a digital signal from the baseband signal as a function of the baseband control signal provided by the baseband processor control unit.

27. The method of claim 26, further comprising the step of:

selecting a set of baseband processing parameters based on the control signal.

28. The method of claim 27, wherein the step of generating a digital signal comprises the step of:

generating the digital signal using the selected set of baseband processing parameters.

29. The method of claim 28, wherein the selected set of baseband processing parameters includes channel tracking parameters.

30. The method of claim 28, wherein the selected set of baseband processing parameters includes automatic frequency control parameters.

* * * * *